(12) United States Patent
Mittal et al.

(10) Patent No.: US 9,256,579 B2
(45) Date of Patent: Feb. 9, 2016

(54) APPARATUS AND METHOD FOR LOW COMPLEXITY COMBINATORIAL CODING OF SIGNALS

(71) Applicant: MOTOROLA MOBILITY LLC, Libertyville, IL (US)

(72) Inventors: Udar Mittal, Hoffman Estates, IL (US);
James P. Ashley, Naperville, IL (US);
Edgardo M. Cruz-Zeno, Round Lake, IL (US)

(73) Assignee: GOOGLE TECHNOLOGY HOLDINGS LLC, Mountain View, CA (US)

( * ) Notice: Subject to any disclaimer, the term of this patent is extended or adjusted under 35 U.S.C. 154(b) by 201 days.

(21) Appl. No.: 13/894,557

(22) Filed: May 15, 2013

(65) Prior Publication Data

US 2013/0254249 A1 Sep. 26, 2013

Related U.S. Application Data

(60) Continuation of application No. 12/196,414, filed on Aug. 22, 2008, now Pat. No. 8,495,115, which is a division of application No. 11/531,122, filed on Sep. 12, 2006, now Pat. No. 7,461,106.

(51) Int. Cl.
| | | |
|---|---|---|
| *G06F 17/17* | (2006.01) | |
| *H03M 7/14* | (2006.01) | |
| *G10L 19/02* | (2013.01) | |
| *G10L 19/035* | (2013.01) | |

(52) U.S. Cl.
CPC .............. *G06F 17/17* (2013.01); *H03M 7/14* (2013.01); *G10L 19/0212* (2013.01); *G10L 19/035* (2013.01)

(58) Field of Classification Search
None
See application file for complete search history.

(56) References Cited

U.S. PATENT DOCUMENTS

| | | | |
|---|---|---|---|
| 4,560,977 | A | 12/1985 | Murakami et al. |
| 4,670,851 | A | 6/1987 | Murakami et al. |
| 4,727,354 | A | 2/1988 | Lindsay |
| 4,853,778 | A | 8/1989 | Tanaka |
| 5,006,929 | A | 4/1991 | Barbero et al. |
| 5,067,152 | A | 11/1991 | Kisor et al. |
| 5,268,855 | A | 12/1993 | Mason et al. |
| 5,327,521 | A | 7/1994 | Savic et al. |

(Continued)

FOREIGN PATENT DOCUMENTS

| | | |
|---|---|---|
| EP | 1533789 A1 | 5/2005 |
| EP | 0932141 B1 | 8/2005 |

(Continued)

OTHER PUBLICATIONS

United States Patent and Trademark Office, "Final Rejection" for U.S. Appl. No. 12/099,842 dated Aug. 8, 2013, 16 pages.

(Continued)

*Primary Examiner* — Michael D Yaary
(74) *Attorney, Agent, or Firm* — Birch, Stewart, Kolasch & Birch, LLP (57) ABSTRACT

The invention utilizes low complexity estimates of complex functions to perform combinatorial coding of signal vectors. The invention disregards the accuracy of such functions as long as certain sufficient properties are maintained. The invention in turn may reduce computational complexity of certain coding and decoding operations by two orders of magnitude or more for a given signal vector input.

10 Claims, 4 Drawing Sheets

Decoder

(56) References Cited

U.S. PATENT DOCUMENTS

| | | | |
|---|---|---|---|
| 5,394,473 | A | 2/1995 | Davidson |
| 5,956,674 | A | 9/1999 | Smyth et al. |
| 5,974,435 | A | 10/1999 | Abbott |
| 6,108,626 | A | 8/2000 | Cellario et al. |
| 6,236,960 | B1 | 5/2001 | Peng et al. |
| 6,253,185 | B1 | 6/2001 | Arean et al. |
| 6,263,312 | B1 | 7/2001 | Kolesnik et al. |
| 6,304,196 | B1 | 10/2001 | Copeland et al. |
| 6,453,287 | B1 | 9/2002 | Unno et al. |
| 6,493,664 | B1 | 12/2002 | Udaya Bhaskar et al. |
| 6,504,877 | B1 | 1/2003 | Lee |
| 6,593,872 | B2 | 7/2003 | Makino et al. |
| 6,658,383 | B2 | 12/2003 | Koishida et al. |
| 6,662,154 | B2 | 12/2003 | Mittal et al. |
| 6,691,092 | B1 | 2/2004 | Udaya Bhaskar et al. |
| 6,704,705 | B1 | 3/2004 | Kabal et al. |
| 6,775,654 | B1 | 8/2004 | Yokoyama et al. |
| 6,813,602 | B2 | 11/2004 | Thyssen |
| 6,940,431 | B2 | 9/2005 | Hayami |
| 6,975,253 | B1 | 12/2005 | Dominic |
| 7,031,493 | B2 | 4/2006 | Fletcher et al. |
| 7,130,796 | B2 | 10/2006 | Tasaki |
| 7,161,507 | B2 | 1/2007 | Tomic |
| 7,180,796 | B2 | 2/2007 | Tanzawa et al. |
| 7,212,973 | B2 | 5/2007 | Toyama et |
| 7,230,550 | B1 | 6/2007 | Mittal et al. |
| 7,231,091 | B2 | 6/2007 | Keith |
| 7,414,549 | B1 | 8/2008 | Yang et al. |
| 7,761,290 | B2 | 7/2010 | Koishida et al. |
| 7,801,732 | B2 | 9/2010 | Park et al. |
| 7,840,411 | B2 | 11/2010 | Hotho et al. |
| 7,885,819 | B2 | 2/2011 | Koishida et al. |
| 7,889,103 | B2 | 2/2011 | Mittal et al. |
| 7,996,233 | B2 | 8/2011 | Oshikiri |
| 8,060,363 | B2 | 11/2011 | Ramo et al. |
| 8,069,035 | B2 | 11/2011 | Yoshida |
| 8,160,868 | B2 | 4/2012 | Kawashima et al. |
| 8,315,863 | B2 | 11/2012 | Oshikiri |
| 8,423,355 | B2 | 4/2013 | Mittal et al. |
| 8,428,936 | B2 | 4/2013 | Mittal et al. |
| 2002/0052734 | A1 | 5/2002 | Unno et al. |
| 2003/0004713 | A1 | 1/2003 | Makino et al. |
| 2003/0009325 | A1 | 1/2003 | Kirchherr et al. |
| 2003/0220783 | A1 | 11/2003 | Streich et al. |
| 2004/0252768 | A1 | 12/2004 | Suzuki et al. |
| 2005/0261893 | A1 | 11/2005 | Toyama et al. |
| 2006/0047522 | A1 | 3/2006 | Ojanpera |
| 2006/0173675 | A1 | 8/2006 | Ojanpera |
| 2006/0190246 | A1 | 8/2006 | Park |
| 2006/0222374 | A1 | 10/2006 | Gnauck et al. |
| 2006/0241940 | A1 | 10/2006 | Ramprashad |
| 2006/0265087 | A1 | 11/2006 | Philippe et al. |
| 2007/0171944 | A1 | 7/2007 | Schuijers et al. |
| 2007/0239294 | A1 | 10/2007 | Brueckner et al. |
| 2007/0271102 | A1 | 11/2007 | Morii |
| 2008/0120096 | A1 | 5/2008 | Oh et al. |
| 2009/0030677 | A1 | 1/2009 | Yoshida |
| 2009/0076829 | A1 | 3/2009 | Ragot et al. |
| 2009/0100121 | A1 | 4/2009 | Mittal et al. |
| 2009/0112607 | A1 | 4/2009 | Ashley et al. |
| 2009/0234642 | A1 | 9/2009 | Mittal et al. |
| 2009/0259477 | A1 | 10/2009 | Ashley et al. |
| 2009/0276212 | A1 | 11/2009 | Khalil et al. |
| 2009/0306992 | A1 | 12/2009 | Ragot et al. |
| 2009/0326931 | A1 | 12/2009 | Ragot et al. |
| 2010/0088090 | A1 | 4/2010 | Ramabadran |
| 2010/0169087 | A1 | 7/2010 | Ashley et al. |
| 2010/0169099 | A1 | 7/2010 | Ashley et al. |
| 2010/0169100 | A1 | 7/2010 | Ashley et al. |
| 2010/0169101 | A1 | 7/2010 | Ashley et al. |
| 2011/0161087 | A1 | 6/2011 | Ashley et al. |
| 2012/0226506 | A1 | 9/2012 | Ashley et al. |

FOREIGN PATENT DOCUMENTS

| | | |
|---|---|---|
| EP | 1619664 A1 | 1/2006 |
| EP | 1483759 B1 | 9/2006 |
| EP | 1818911 A1 | 8/2007 |
| EP | 1912206 A1 | 4/2008 |
| EP | 1845519 B1 | 9/2009 |
| EP | 1959431 B1 | 6/2010 |
| RU | 2137179 C1 | 9/1999 |
| WO | 9715983 A1 | 5/1997 |
| WO | 03073741 A2 | 9/2003 |
| WO | 2007012794 A2 | 2/2007 |
| WO | 2007063910 A1 | 6/2007 |
| WO | 2008063035 A1 | 5/2008 |
| WO | 2010003663 A1 | 1/2010 |

OTHER PUBLICATIONS

3GPP TS 26.290 v7.0.0 (Mar. 2007) 3rd Generation Partnership Project; Technical Speciification Group Service and System Aspects; Audio codec processing functions; Extended Adaptive Multi0Rate—Wideband (AMR-WB+) codec; Transcoding functions (Release 7).

Chen et al.; "Adaptive Postifiltering for Quality Enhancement of Coded Speech" IEEE Transactions on Speech and Audio Processing, vol. 3, No. 1, Jan. 1995, pp. 59-71.

Chan et al.; "Frequency domain postfiltering for multiband excited linear predictive coding of speech" Electronics Letters, Jun. 6, 1996, vol. 32 No. 12; pp. 1061-1063.

Andersen et al.; "Reverse Water-Filling in Predictive Encoding of Speech" IEEE 1999 pp. 105-107.

International Telecommunication Union, "G.7291, Series G: Transmission Systems and Media, Digital Systems and Networks, Digital Terminal Equipments—Coding of analogue signals by methods other than PCM, G.729 based Embedded Variable bit-rate coder: An 8-32 kbits scalable wideband coder bitstream interoperatble with G.729" ITU=T Recommondation G.729.1, May 2006, Cover page, pp. 11-18. Full document available at: http://www.itu.int/rec/T-rec-G.729.1-200605-I/en.

Makinen et al., "AMR-WB+: a new audio coding standard for 3rd generation mobile audio service", In 2005 Proceedings IEEE International Conference on Acoustics, Speech and Signal Processing, vol. 2, pp. ii/1109-ii/1112, Mar. 18, 2005.

Faller et al., "Technical advances in digital audio radio broadcasting", Proceedings of the IEEE, vol. 90, No. 8, pp. 1303-1333, Aug. 1, 2002.

Salami et al., "Extended AMR-WB for High-Quality Audio on Mobile Devices", IEEE Communications Magazine, pp. 90-97, May 1, 2006.

Hung, et al., "Error Resilient Pyramid Vector Quantization for Image Compression," IEEE 1994 pp. 583-587, Computer Systems Laboratory, Stanford University, Stanford, CA, USA.

Ramprashad: "A Two Stage Hybrid Embedded Speech/Audio Coding Structure" Proceedings of International Conference on Acoustics, Speech, and Signal Processing, ICASSP 1998 May 1998, vol. 1, pp. 337-340.

Kovesi et al.; "A Scalable Speech and Audio Coding Scheme with Continuous Bitrate Flexibility" Proceeding of International Conference on Acoustics, Speech, and Signal Processing, 2004, Piscataway, JY vol. 1, May 17, 2004 pp. 273-276.

Kim et al.; "A New Bandwidth Scalable Wideband Speech/Aduio Coder" Proceedings of Proceedings of International Conference on Acoustics, Speech, and Signal Processing, ICASSP; Orland, FL; ; vol. 1, May 13, 2002 pp. 657-660.

Ramprashad: "High Quality Embedded Wideband Speech Coding Using an Inherently Layered Coding Paradigm" Proceedings of International Conference on Acoustics, Speech, and Signal Processing, ICASSP 2000, vol. 2, Jun. 5-9, 2000 pp. 1145-1148.

Hung, et al., "Error Resilient Pyramid Vector Quantization for Image Compression," IEEE Transactions on Image Processing, vol. 7, No. 10, Oct. 1998, pp. 1373-1386.

Ramprashad: "Embedded Coding Using a Mixed Speech and Audio Coding Paradigm" International Journal of Speech Technology Kluwer Academic Publishers Netherlands, Vo. 2, No. 4, May 1999, pp. 359-372.

(56) References Cited

OTHER PUBLICATIONS

Cadel, et al, "Pyramid Vector Coding for High Quality Audio Compression," IEEE 1997, pp. 343-346, Cefriel, Milano, Italy and Alcatel Telecom, Vimercate, Italy.

Ashley, et al., "Wideband Coding of Speech Using a Scalable Pulse Codebook," IEEE 2000, pp. 148-150, Motorola Labs, Schaumburg, Illinois, USA.

Markas et al. "Multispectral Image Compression Algorithms"; Data Compression Conference, 1993; Snowbird, UT USA Mar. 30-Apr. 2, 1993; pp. 391-400.

Mittal et al., Low complexity factorial pulse coding of MDCT coefficients using approximation of combinatorial functions, Acoustics, Speech and Signal Processing, 2007. ICASSP 2007. IEEE International Conference on, Apr. 1, 2007, pp. 1-289-1-292.

"Enhanced Variable Rate Codec, Speech Service Options 3, 68, and 70 for Wideband Spread Spectrum Digital Systems", 3GPP2 TSG-C Working Group 2, XX, XX, No. C. S0014-C, Jan. 1, 2007, pp. 1-5.

Mittal, et al., "Coding Unconstrained FCB Excitation Using Combinatorial and Huffman Codes," IEEE 2002, pp. 129-131, Motorola Labs, Schaumburg, Illinois, USA.

Neuendorf, et al., "Unified Speech Audio Coding Scheme for High Quality oat Low Bitrates" ieee International Conference on Accoustics, Speech and Signal Processing, 2009, Apr. 19, 2009, 4 pages.

Boris Ya Ryabko et al.: "Fast and Efficient Construction of an Unbiased Random Sequence", IEEE Transactions on Information Theory, IEEE, US, vol. 46, No. 3, May 1, 2000, ISSN: 0018-9448, pp. 1090-1093.

Ratko V. Tomic: "Quantized Indexing: Background Information", May 16, 2006, URL: http://web.archive.org/web/20060516161324/www.1stworks.com/ref/TR/tr05-0625a.pdf, pp. 1-39.

Ido Tal et al.: "On Row-by-Row Coding for 2-D Constraints", Information Theory, 2006 IEEE International Symposium on, IEEE, PI, Jul. 1, 2006, pp. 1204-1208.

Bessette: "Universal Speech/Audio Coding using Hybrid ACELP/TCX Techniques", Acoustics, Speech, and Signal Processing, 2005. Proceedings. (ICASSP '05). IEEE International Conference, Mar. 18-23, 2005, ISSN : III-301-III-304, Print ISBN: 0-78.

Tancerel, L. et al., "Combined Speech and Audio Coding by Discrimination," In Proceedings of IEEE Workshop on Speech Coding, pp. 154-156, (2000).

Ramo et al. "Quality Evaluation of the G.EV-VBR Speech CODEC" Apr. 4, 2008, pp. 4745-4748.

Jelinek et al. "ITU-T G.Ev-VBR Baseline CODEC" Apr. 4, 2008, pp. 4749-4752.

Jelinek et al. "Classification-Based Techniques for Improving the Robustness of CELP Coders" 2007, pp. 1480-1484.

Fuchs et al. "A Speech Coder Post-Processor Controlled by Side-Information" 2005, pp. IV-433-IV-436.

J. Fessler, "Chapter 2; Discrete-time signals and systems" May 27, 2004, pp. 2.1-2.21.

Virette et al "Adaptive Time-Frequency Resolution in Modulated Transform at Reduced Delay" ICASSP 2008; pp. 3781-3784.

Edler "Coding of Audio Signals with Overlapping Block Transform and Adaptive Window Functions"; Journal of Vibration and Low Voltage fnr; vol. 43, 1989, Section 3.1.

Cover, T.M., "Enumerative Source Encoding" IEEE Transactions on Information Theory, IEEE Press, USA vol. IT-19, No. 1; Jan. 1, 1973, pp. 73-77.

Mackay, D., "Information Theory, Inference, and Learning Algorithms" In: "Information Theory, Inference, and Learning Algorithms", Jan. 1, 2004; pp. 1-10.

Ratko V. Tomic: Fast, Optimal Entropy Coder, 1stWorks Corporation Technical Report TR04-0815; Aug. 15, 2004; pp. 1-52.

Princen, J. P. et al.: "Subband/Transform Coding Using Filter Bank Designs Based on Time Domain Aliasing Cancellation", 1987 IEEE, CH2396-0/87/0000-2161, all pages.

FIG. 1
Encoder

FIG. 2
Decoder

FIG. 3

APPARATUS AND METHOD FOR LOW COMPLEXITY COMBINATORIAL CODING OF SIGNALS

RELATED APPLICATIONS

This application is a continuation application of U.S. patent application Ser. No. 12/196,414 filed Aug. 22, 2008 that is a divisional application of U.S. patent application Ser. No. 11/531,122 filed Sep. 12, 2006 now U.S. Pat. No. 7,461, 106 granted Dec. 2, 2008.

FIELD OF THE INVENTION

The present invention relates generally to coding vectors and in particular, to low-complexity combinational Factorial Pulse Coding of vectors.

BACKGROUND OF THE INVENTION

Methods for coding vector or matrix quantities for speech, audio, image, video, and other signals are well known. One such method described in U.S. Pat. No. 6,236,960 by Peng, et. al, (which is incorporated by reference herein) is known as Factorial Pulse Coding (or FPC). FPC can code a vector $x_i$ using a total of M bits, given that:

$$m = \sum_{i=0}^{n-1} |x_i|, \quad (1)$$

and all values of vector $x_i$ are integral valued such that $-m \le x_i \le m$, where m is the total number of unit amplitude pulses, and n is the vector length. The total M bits are used to code N combinations in a maximally efficient manner, such that the following expression, which describes the theoretical minimum number of combinations, holds true:

$$N = \sum_{d=1}^{min(m,n)} F(n,d)D(m,d)2^d \le 2^M. \quad (2)$$

For this equation, F(n,d) are the number of combinations of d non-zero vector elements over n positions given by:

$$F(n,d) = \frac{n!}{d!(n-d)!}, \quad (3)$$

D(m,d) are the number of combinations of d non-zero vector elements given m total unit pulses given by:

$$D(m,d) = F(m-1, d-1), \quad (4)$$

and $2^d$ represents the combinations required to describe the polarity (sign) of the d non-zero vector elements. The term min(m,n) allows for the case where the number of unit magnitude pulses m exceeds the vector length n. A method and apparatus for coding and decoding vectors of this form have been fully described in the prior art. Furthermore, a practical implementation of this coding method has been described in 3GPP2 standard C.S0014-B, where the vector length n=54 and the number of unit magnitude pulses m=7 produce an M=35 bit codeword.

While these values of n and m do not cause any unreasonable complexity burden, larger values can quickly cause problems, especially in mobile handheld devices which need to keep memory and computational complexity as low as possible. For example, use of this coding method for some applications (such as audio coding) may require n=144 and m=28, or higher. Under these circumstances, the cost associated with producing the combinatorial expression F(n,d) using prior art methods may be too high for practical implementation.

In looking at this cost in greater detail, we can rewrite Eq. 3 as:

$$F(n,d) = \frac{\prod_{i=n-d+1}^{n} (i)}{\prod_{j=1}^{d} (j)}. \quad (5)$$

Direct implementation is problematic because F(144,28) would require 197 bits of precision in the numerator and 98 bits of precision in the nominator to produce a 99 bit quotient. Since most digital signal processors (DSPs) used in today's handheld devices typically support only 16 bit×16 bit multiply operations, special multi-precision multiply/divide routines would need to be employed. Such routines require a series of nested multiply/accumulate operations that typically require on the order of k multiple/accumulate (MAC) operations, where k is the number of 16 bit segments in the operand. For a 197 bit operand, k=⌈197/16⌉=13. So, execution of a single 197×16 bit multiply would require a minimum of 13 MAC operations plus shifting and store operations. The denominator term is calculated in a similar manner to produce a 98 bit result. In addition, a 197/98 bit division is required, which is an extremely complex operation, thus computation of the entire factorial relation in Eq. 5 would require considerable resources.

In an effort to reduce complexity, Eq. 5 can be rewritten in to distribute the divide operations to produce the following:

$$F(n,d) = \text{round}\left[\left(\frac{n}{d}\right) \cdot \left(\frac{n-1}{d-1}\right) \cdot \left(\frac{n-2}{d-2}\right) \cdots \left(\frac{n-d+2}{2}\right) \cdot \left(\frac{n-d+1}{1}\right)\right] \quad (6)$$

In this expression, the dynamic range of the divide operations is reduced, but unfortunately, increased resolution of the quotient is needed to accurately represent division by 3, 7, 9, etc. In order to accommodate this structure, a rounding operation is also needed to guarantee an integer result. Given the large number of high precision divide operations, this implementation does not adequately address the complexity problem for large m and n, and further has the potential to produce an incorrect result due to accumulated errors in precision.

In yet another implementation, Eq. 5 can be rearranged in the following manner:

$$F(n,d) = n \cdot (n-1) \cdot \left(\frac{1}{2}\right) \cdot (n-2) \cdot \left(\frac{1}{3}\right) \quad (7)$$
$$\cdots (n-d+2) \cdot \left(\frac{1}{d-1}\right) \cdot (n-d+1) \cdot \left(\frac{1}{d}\right).$$

If this expression is evaluated from left to right, the result will always produce an integer value. While this method controls the precision and dynamic range issue to some degree, large values of m and n still require extensive use of multi-precision multiply and divide operations.

Finally, in order to minimize computational complexity, it may be possible to pre-compute and store all factorial combinations in a lookup table. Thus, all values of F(n,m) may be simply stored in an n×m matrix and appropriately retrieved from memory using very few processor cycles. The problem with this approach, however, is that as n and m become large, so does the associated memory requirement. Citing the previous example, F(144,28) would require 144×28×⌈99 bits/8 bits/byte⌉=52,416 bytes of storage, which is unreasonable for most mobile handheld devices. Therefore, a need exists for a method and apparatus for low-complexity combinational Factorial Pulse Coding of vectors.

DETAILED DESCRIPTION OF THE DRAWINGS

In order to address the above-mentioned need, a method and apparatus for low-complexity combinatorial coding of vectors is provided herein. During operation an encoder and decoder will use relatively low resolution approximations of factorial combinations F'(n,d), which provide only enough precision to allow a valid codeword to be generated. Particularly, both an encoder and a decoder will utilize a combinatorial function generator to derive F'(n,d) such that F'(n,d)≥F(n,d), and F'(n,d)≥F'(n−1,d)+F'(n−1,d−1). F'(n,d) will be provided to either coding or decoding circuitry to produce a combinatorial codeword or vector $x_i$, respectively.

Because F'(n,d) will have a lower precision than F(n,d), it is generally much easier to compute on a fixed point digital signal processor (DSP), general purpose microprocessor, or implement in hardware, such as on a programmable logic device or application specific integrated circuit (ASIC). In essence, complicated multi-precision multiplications and divisions are replaced with relatively low precision additions and subtractions, coupled with a small amount of table memory. Generally, the lower complexity operations do not affect the overall coding rate of the input vectors, but it may be possible to lower the complexity even further than is described herein at the expense of a slightly higher bit-rate.

The present invention encompasses a method for combinatorial coding and decoding. The method comprising the steps of receiving a value n based on the number of positions in a vector receiving a value d based on the number of occupied positions within the vector creating F'(n,d) based on n and d, wherein F'(n,d) is an estimate of F(n,d) such that F'(n,d)>F(n,d) and F'(n,d)>F'(n−1,d)+F'(n−1,d−1), and wherein $$F(n, d) = \frac{n!}{d!(n-d)!},$$

and using F'(n,d) to code or decode the vector.

The present invention additionally encompasses an apparatus comprising a combinatorial function generator outputting F'(n,r) having the properties F'(n,r)≥F(n,r) and F'(n,r)≥F'(n−1,r)+F'(n−1,r−1), which are sufficient to uniquely encode/decode vector $X_{cc}$. The function F'(n,r) is given as:

$$F'(n, r) = R\left(\sum_{i=n-r+1}^{n} P'(i) - Q'(r)\right),$$

where P'(i) and Q'(r) are 32 bit lookup tables given as:

$$P'(i) = 2^{-21}\lfloor 2^{21}\log_2(i) + 1\rfloor,$$

$$i \in [1, 2, \ldots, 144]$$

and $$Q'(r) = \begin{cases} 0, & r = 1 \\ \sum_{j=2}^{r} 2^{-14}\lfloor 2^{14}\log_2(j) - 1\rfloor, & r \in [2, \ldots, 28], \end{cases}$$

and where R'(k) is an approximation of the function R'(k)≈$2^k$, given as:

$$R'(k)\lfloor 2^{k_i-19}\lfloor 2^{19}K_f\rfloor\rfloor, \quad (4.13.5\text{-}1)$$

where k=$k_i$+$k_f$ is broken down into integer and fractional components of k, and $K_f$=$2^{k_f}$ is a low resolution Taylor series expansion of the fractional component of k. The apparatus additionally comprises a coder or decoder receiving F'(n,r) and a vector and outputting a codeword or a vector based on F'(n,r).

The present invention additionally encompasses an apparatus comprising a combinatorial function generator receiving a value n based on the number of positions in a vector, receiving a value d based on the number of occupied positions within the vector and creating F'(n,d) based on n and d, wherein F'(n,d) is an estimate of F(n,d) such that F'(n,d)>F(n,d) and F'(n,d)>F'(n−1,d)+F'(n−1,d−1), and where $$F(n, d) = \frac{n!}{d!(n-d)!}.$$

The apparatus additionally comprises an encoder using F'(n,d) to code the vector, and outputting a codeword.

The present invention additionally encompasses an apparatus comprising a combinatorial function generator receiving a value n based on the number of positions in a vector, receiving a value d based on the number of occupied positions within the vector and creating F'(n,d) based on n and d, wherein F'(n,d) is an estimate of F(n,d) such that F'(n,d)>F(n,d) and F'(n,d)>F'(n−1,d)+F'(n−1,d−1), and where $$F(n, d) = \frac{n!}{d!(n-d)!}.$$

The apparatus additionally comprises a decoder using F'(n,d) to decode a codeword, and outputting the vector.

Figure 1:
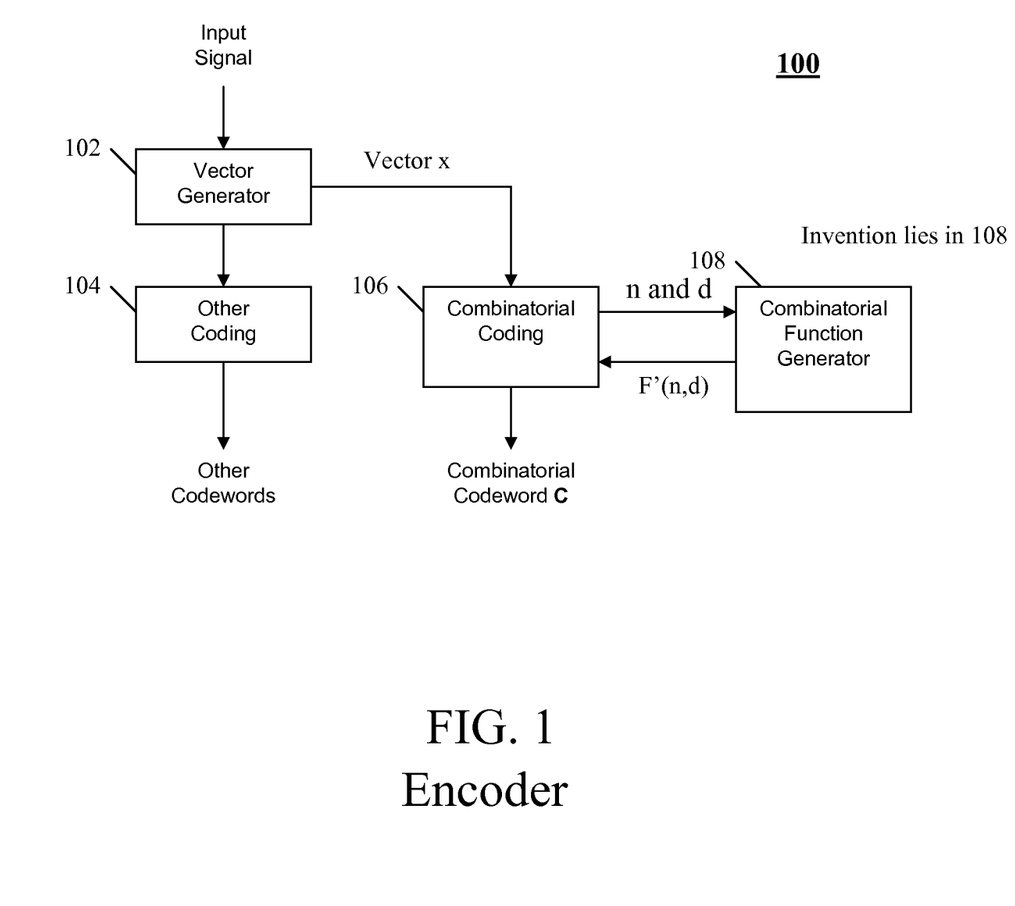
FIG. 1 is a block diagram of an encoder.

Turning now to the drawings, wherein like numerals designate like components, FIG. 1 is a block diagram of encoder 100. Encoder 100 comprises vector generator 102, combinational coding circuitry (coder) 106, combination function generator 108, and other coding circuitry 104. During operation, an input signal to be coded is received by vector generator 102. As is known in the art, the input signal may comprise such signals as speech, audio, image, video, and other signals.

Vector generator 102 receives the input signal and creates vector $x_i$. Vector generator 102 may comprise any number of encoding paradigms including, but not limited to, Code-Excited Linear Prediction (CELP) speech coding as described by Peng, et. al, transform domain coding for audio, images and video including Discrete Fourier Transform (DFT), Discrete Cosine Transform (DCT), and Modified Discrete Cosine Transform (MDCT) based methods, wavelet based transform coding, direct time domain pulse code modulation (PCM), differential PCM, adaptive differential PCM (AD-PCM), or any one of a family of sub-band coding techniques that are well known in the art. Virtually any signal vector of the form given above may be advantageously processed in accordance with the present invention.

Combinatorial coding circuitry 106 receives vector $x_i$ and uses Factorial Pulse Coding to produce a codeword C. As discussed above Factorial Pulse Coding can code a vector $x_i$ using a total of M bits, given that $m = \sum_{i=0}^{n-1} |x_i|$, and all values of vector $x_i$ are integral valued such that $-m \leq x_i \leq m$, where m is the total number of unit amplitude pulses, and n is the vector length. As discussed above, larger values of m and n can quickly cause problems, especially in mobile handheld devices which need to keep memory and computational complexity as low as possible.

In order to address this issue, combinatorial function generator 108 utilizes a low complexity technique for producing F'(n,d). Combinatorial coding circuitry 106 then utilizes F'(n,d) to produce codeword C. Circuitry 108 utilizes relatively low resolution approximations (bits of precision) of factorial combinations F'(n,d), which provide only enough precision to allow a valid codeword to be generated. That is, as long as certain properties are maintained, a suitable approximation of the function F(n,d) is sufficient to guarantee that the resulting codeword is uniquely decodable.

In order to describe the generation of F'(n,d), let us proceed by first deriving a function F'(n,d) that is a suitable approximation of F(n,d). The first step is to take the logarithm of an arbitrary base a of Eq. 5, and taking the inverse log base a of the rearranged terms:

$$F(n, d) = \exp_a\left(\sum_{i=n-d+1}^{n} \log_a(i) - \sum_{j=1}^{d} \log_a(j)\right), \quad (8)$$

where the function $\exp_a(k) = a^k$. Next, define functions P(i), Q(d), and R(k), and substitute into Eq. 8 such that:

$$F(n, d) = R\left(\sum_{i=n-d+1}^{n} P(i) - Q(d)\right), \quad (9)$$

where $P(i) = \log_a(i),$ $Q(d) = \sum_{j=1}^{d} \log_a(j),$ and $R(k) = \exp_a(k) = a^k.$ However, in accordance with the preferred embodiment of the present invention, it is not necessary for F(n,d) and F'(n,d) to be equivalent in order for the resulting codeword to be uniquely decodable. There are only two conditions that are sufficient for this to hold true:

$$F'(n,d) \geq F(n,d), \quad (10)$$

and $$F'(n,d) \geq F'(n-1,d) + F'(n-1,d-1). \quad (11)$$

For the first condition, the restriction simply says that if F'(n,d)<F(n,d), then there will be overlapping code-spaces, and subsequently, there will be more than one input capable of generating a particular codeword; thus, the codeword is not uniquely decodable. The second condition states that the "error" for a given n,d shall be greater than or equal to the sum of the error terms associated with the previous element of the recursive relationship described by Peng, et. al in U.S. Pat. No. 6,236,960. It can be shown that F(n,d)=F(n-1,d)+F(n-1,d-1), which is only true if the combinatorial expression is exactly equal to $F(n,d) = C_d^n = n!/d!(n-d)!$. However, while the inequality in Eq. 11 is sufficient, it may not necessarily be true for all values of n and d. For such values, F(n,d) may satisfy another inequality derived from Eq. 31 of Peng, et al. and is given by:

$$F(n, d) > \sum_{i=1}^{d} F(n - (d - i + 1), i). \quad (12)$$

In this case, Eq. 11 has to be satisfied with strict inequality for certain (m,k), (m≤n), (k≤d), that is:

$$F(m,k) > F(m-1,k) + F(m-1,k-1), m \leq n, k \leq d. \quad (13)$$

Referring back to Eq. 9, we now wish to generate F'(n,d) by creating the functions P'(i), Q'(d), and R'(k), with low complexity approximations of the original functions such that:

$$F'(n, d) = R'\left(\sum_{i=n-d+1}^{n} P'(i) - Q'(d)\right), \quad (14)$$

and where the conditions given in Eqs. 10 and 11 are satisfied. Considering P(i), we may wish to approximate the function such that $P'(i) \geq \log_a(i)$, $i \in [1, 2, \ldots, n]$. If we choose a=2 and then restrict P'(i) to 32 bits of precision, the resulting operations are easy to implement on a handheld mobile device since most DSPs support single cycle 32 bit additions. Therefore, we define:

$$P'(i) = 2^{-l(i)} \lfloor 2^{l(i)} \log_2(i) + 1 \rfloor, i \in [1, 2, \ldots, n], \quad (15)$$

where l(i) is a shift factor that may vary as a function of i. In the preferred embodiment, l(i)=l=21, but many other sets of values are possible. For this example, the $2^l$ factor is equivalent to a shift of l bits to the left, whereby the floor function $\lfloor x+1 \rfloor$ removes the fractional bits while rounding up to the next highest integer, and finally the $2^{-l}$ factor shifts the results back to the right by l bits. Using this methodology, the function $P'(i) \geq \log_2(i)$ for all $i \geq 1$, and also provides sufficient dynamic range and precision using only 32 bits because 9 bits of positive integer resolution in the $\log_2$ domain can represent a 512 bit number. To avoid the complexity of computing these values in real-time, they can be pre-computed and stored in a table using only 144×4 bytes of memory for the F(144,28) example. Using a similar methodology for approximating Q(d), we get:

$$Q'(d) = \begin{cases} 0, & d = 1 \\ \sum_{j=2}^{d} 2^{-l(j)} \lfloor 2^{l(j)} \log_2(j) - 1 \rfloor, & d \in [2, \ldots, m], \end{cases} \quad (16)$$

where the floor function $\lfloor x-1 \rfloor$ is used because of the subtraction of the quantity from the total. This guarantees that $Q'(d) \leq \sum_{j=1}^{d} \log_2(j)$ so that the contribution of Q'(d) will guarantee $F'(n,d) \geq F(n,d)$. While l(j) can assume many values depending on the configuration of m and n, the preferred embodiment uses a value of l(j)=l=14 for the variable shift factor. Like P'(i), Q'(d) can be pre-computed and stored in a table using only 28×4 bytes of memory for the F(144,28) example. For defining R'(k), we need to first define k as:

$$k = \sum_{i=n-d+1}^{n} P'(i) - Q'(d). \quad (17)$$

With P'(i) and Q'(d) defined above, k is preferably a 32 bit number with an 8 bit unsigned integer component $k_i$ and a 24 bit fractional component $k_f$. Using this, we may derive $R'(k) \geq \exp_2(k) = 2^k$ by letting $k = k_i + k_f$ and then taking the inverse logarithm base 2 to yield $2^k = 2^{k_i} 2^{k_f}$. We may then use a Taylor series expansion to estimate the fractional component to the desired precision, represented by $K_f = 2^{k_f}$, rounding up the result using the ceiling function, and then appropriately shifting the result to form a multi-precision result (with only l significant bits), such that:

$$R'(k) = 2^{k_i - l} \lceil 2^l K_f \rceil, \quad (18)$$

where $2^{k_i}$ is the integer shift factor applied to the Taylor series expansion result. Here, l is a shift factor used in a similar manner to Eqs. 15 and 16 to guarantee $R'(k) \geq 2^k$. However, since R'(k) cannot be practically pre-computed for efficient real-time operation, great care must be taken in specifying the exact operations necessary in both the encoder and decoder to ensure that the reconstructed signal vector matches the input signal vector exactly. Note that R'(k) may be obtained from left shifting $\lceil 2^l K_f \rceil$, which can be accurately represented by l bits.

In the above discussion, functions P'(i), Q'(d), and R'(k) have been chosen such that each individual function estimate guarantees that the resulting $F'(n,d) \geq F(n,d)$. However, it is only necessary for the aggregate effect to satisfy this condition. For example, P'(i) and Q'(d) may be as described above, but R'(k) may be a more conventional $R'(k) \approx 2^k$ function which may truncate or round the least significant bits such that R'(k) may be less than $2^k$ for some values of k. This is acceptable as long as this effect is small relative to the effects of P'(i) and Q'(d), so the properties in Eqs. 10 and 11 still hold true.

Also, any functions P'(i), Q'(d), and R'(k) may be used without loss of generality as long as the properties on Eqs. 10 and 11 are satisfied. Care must be taken however, that an increase in bit rate may occur if too little precision is used. It should also be noted that there is an inherent tradeoff in bit rate and complexity, and for large values of m, n, an increase of 1 or 2 bits may be a reasonable tradeoff for a significant reduction in complexity.

Figure 2:
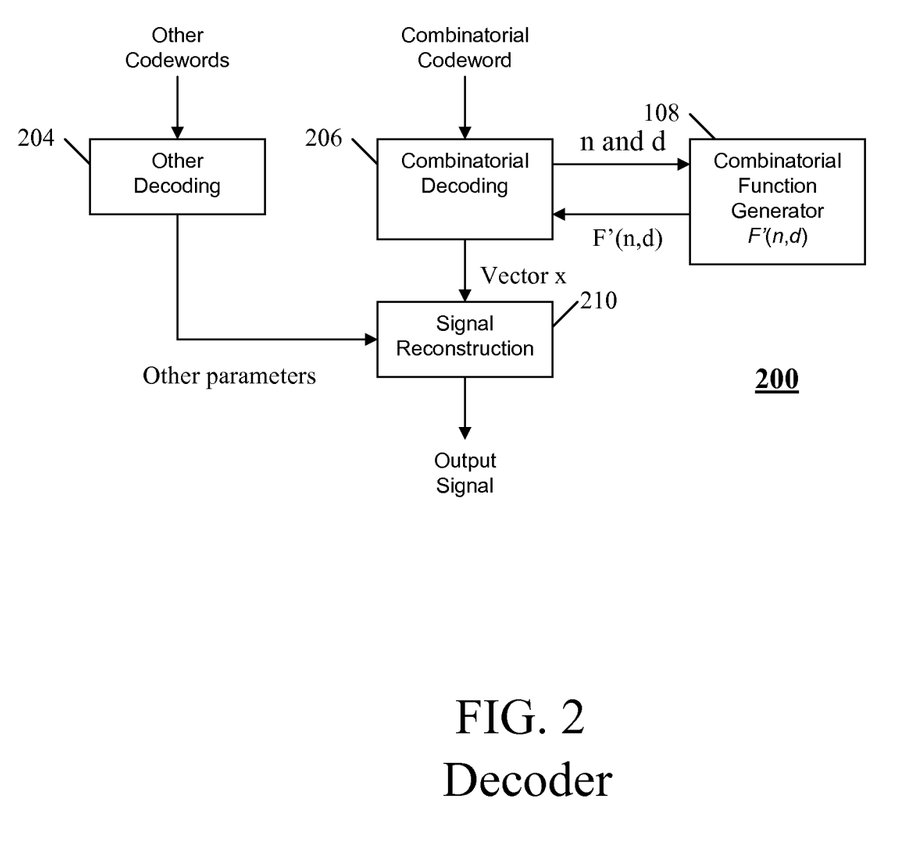
FIG. 2 is a block diagram of a decoder.

FIG. 2 is a block diagram of decoder 200. As shown, decoder 200 comprises combinatorial decoding circuitry (decoder) 206, signal reconstruction circuitry 210, other decoding circuitry 204, and combinatorial function generator 108. During operation a combinatorial codeword is received by combinatorial decoding circuitry 206. Combinatorial decoding circuitry 206 provides n and d to combinatorial function generator, and receives F'(n,d) in response. Decoding circuitry 206 then creates vector $x_i$ based on F'(n,d). Vector $x_i$ is passed to signal reconstruction circuitry 210 where the output signal (e.g., speech, audio, image, video, or other signals) is created based on $x_i$ and other parameters from other decoding circuitry 204. More specifically, the other parameters may include any number of signal reconstruction parameters associated with the signal coding paradigm being used in a particular embodiment. These may include, but are not limited to, signal scaling and energy parameters, and spectral shaping and/or synthesis filter parameters. Normally these parameters are used to scale the energy of and/or spectrally shape the reconstructed signal vector $x_i$ in such a manner as to reproduce the final output signal.

Figure 3:
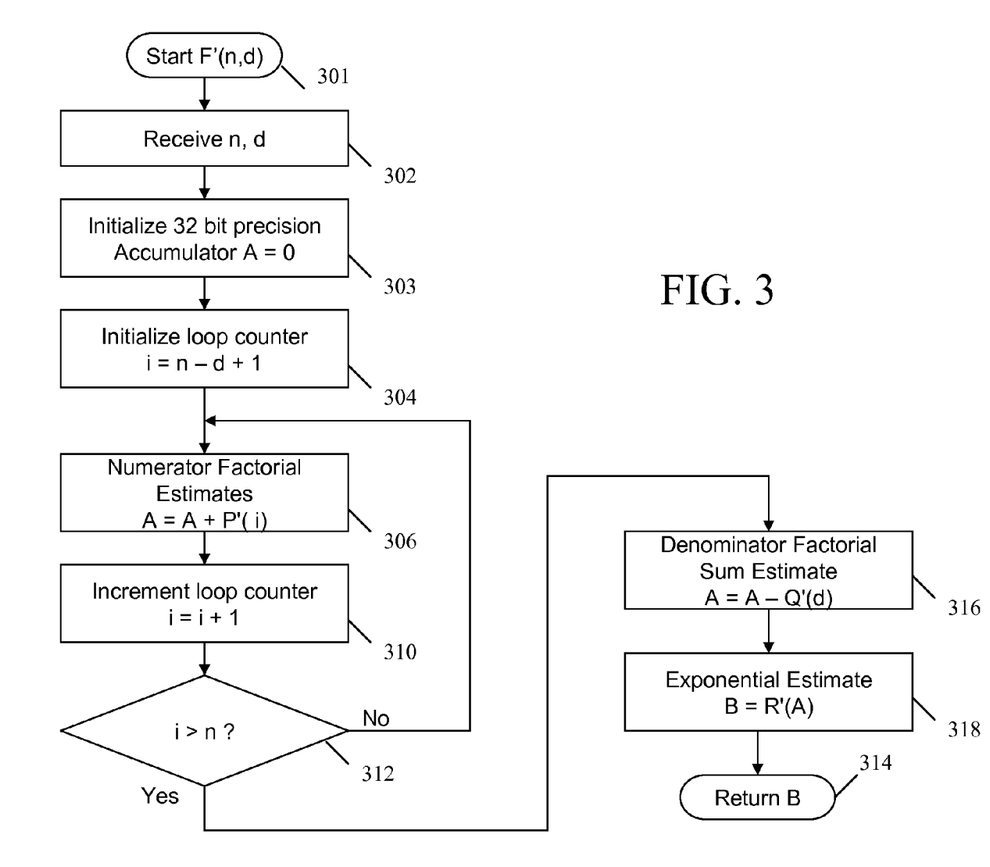
FIG. 3 is a flow chart showing operation of a Combinatorial Function Generator of FIG. 1 and FIG. 2.
Figures 4, 5:
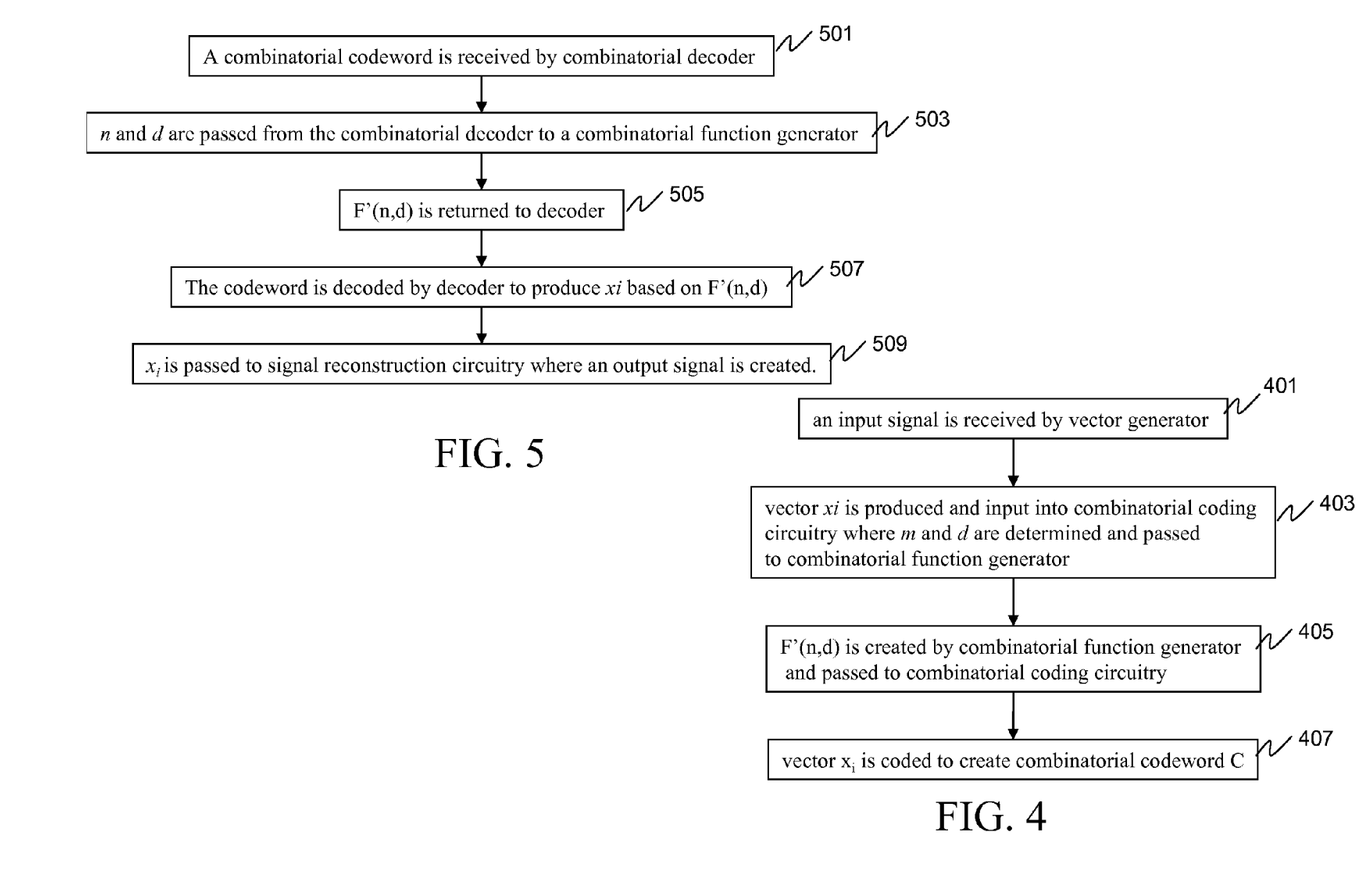
FIG. 4 is a flow chart showing operation of the encoder of FIG. 1.
FIG. 5 is a flow chart showing operation of the decoder of FIG. 2.

FIG. 3 is a flow chart showing operation of a combinatorial function generator of FIG. 1 and FIG. 2. More particularly, the logic flow of FIG. 4 shows those steps necessary for combinatorial function generator 108 to produce F'(n,d). The logic flow begins at step 302 where the inputs n and d are received. At step 303 accumulator A is set to 0. At step 304 the counter i is set equal to n−d+1. At step 306 logarithm approximation P'(i) is added to the accumulator A. At step 310 counter i is incremented by 1. Steps 306 and 310 are repeated in a loop until the counter i is greater than n. Step 312 tests i>n and terminates the loop when i becomes greater than n. At this stage the accumulator contains the logarithm approximate of the numerator of the combinatorial function F(n,d). A logarithm approximation of the denominator of the combinatorial function Q'(d) is subtracted from the accumulator at step 316 to obtain a logarithm approximation of the combinatorial function. At step 318 an exponential approximation R'(A) of the accumulator is taken to generate the approximation B of the combinatorial function. At step 314, B is outputted as F'(n,d). FIG. 4 is a flow chart showing operation of the encoder of FIG. 1. The logic flow begins at step 401 where an input signal is received by vector generator 102. As discussed above, the input signal may comprise speech, audio, image, video, or other signals. At step 403 vector $x_i$ is produced and input into combinatorial coding circuitry 106 where m and d are determined and passed to combinatorial function generator 108. As discussed above, m is the total number of unit amplitude pulses (or sum of the absolute values of the integral valued components of $x_i$) and d is the number non-zero vector elements of $x_i$. At step 405 F'(n,d) is created by combinatorial function generator 108 and passed to combinatorial coding circuitry 106, where vector $x_i$ is coded to create combinatorial codeword C (step 407). As discussed above, F'(n,d) is created by replacing the functions P(i), Q(d), and R(k) in F(n,d), with low complexity approximations of the original functions such that the conditions given in Equations 10 and 11 are satisfied.

FIG. 5 is a flow chart showing operation of the decoder of FIG. 2. The logic flow begins at step 501 where a combinatorial codeword is received by combinatorial decoder 206. At step 503 n and d are passed from combinatorial decoder 206 to combinatorial function generator 108 and F'(n,d) is returned to decoder 206 (step 505). The codeword is decoded by decoder 206 based on F'(n,d) (step 507) to produce vector $x_i$ and $x_i$ is passed to signal reconstruction circuitry 210 where an output signal is created (step 509).

Table 1 shows the complexity reduction associated with the present invention as compared to the prior art. For different values of m and n, the associated number of bits M and average number of function calls per frame to F(n,m) are given. For these examples, the frame length interval is 20 ms, which corresponds to a rate of 50 frames per second. The unit of measure for the complexity comparison is weighted millions of operations per second, or WMOPS. A computer simulation was used to produce an estimate of the complexity as it would be executed on a limited precision fixed point DSP. For these examples, multi-precision libraries were used when appropriate, and each primitive instruction was assigned an appropriate weighting. For example, multiplies and additions, were given a weight of one operation, while primitive divide and transcendental (e.g., $2^x$) operations were given a weight of 25 operations. From the table, it is easy to see that using F'(n,d) provides significant complexity reduction over the prior art, and that the proportional reduction in complexity increases and n and m increase. This complexity reduction is shown to be as high as two orders of magnitude for the F(144,60) case, but would continue to grow as n and m increase further. This is primarily due to the growth in precision of the operands that is required to carry out exact combinatorial expressions in the prior art. These operations prove to result in an excessive complexity burden and virtually eliminate factorial pulse coding as a method for coding vectors having the potential for large m and n. The invention solves these problems by requiring only single cycle low precision operations coupled with a small amount of memory storage to produce estimates of the complex combinatorial expressions required for this type of coding.

TABLE 1

Complexity Comparison of F(n, m) vs. F'(n, m)

|   |   |      |                              | Prior Art F(n, m) |             | Invention F'(n, m) |             |
|---|---|------|------------------------------|-------------------|-------------|--------------------|-------------|
| n | m | Bits | Avg Calls per frame F(n, m) | Peak WMOPS        | Avg WMOPS   | Peak WMOPS         | Avg WMOPS   |
| 54  | 7  | 35  | 44  | 0.44   | 0.32  | 0.09 | 0.07 |
| 144 | 28 | 131 | 191 | 24.50  | 16.45 | 0.51 | 0.37 |
| 144 | 44 | 180 | 279 | 76.45  | 46.65 | 0.96 | 0.64 |
| 144 | 60 | 220 | 347 | 150.00 | 83.25 | 1.50 | 0.90 |

The following text and equations implement the above technique for coding and decoding into the Third Generation Partnership Project 2 (3GPP2) C.P0014-C specification for Enhanced Variable Rate Codec, Speech Service Options 3, 68, and 70 for Wideband Spread Spectrum Digital Systems.

4.13.5 MDCT Residual Line Spectrum Quantization

The MDCT coefficients, referred to as the residual line spectrum, are quantized in a similar manner to the FCB factorial codebook of 4.11.8.3. Basically, factorial coding of $N = {}^n FPC_m$ possible combinations can be achieved given that the length n vector v has the properties $m = \sum_{i=0}^{n-1} |v_i|$ and all elements $v_i$ are integral valued. That is, the sum of the absolute value of the integer elements of v is equal to m. For this case, we wish to code an energy scaled version of $X_k$ such that:

$$m = \sum_{k=0}^{143} |\text{round}\{\gamma_m X_k\}|, \quad (4.13.5\text{-}1)$$

where $\gamma_m$ is a global scale factor, and the range 0 to 143 corresponds to the frequency range 0 to 3600 Hz. For this case, m can be either 28 for NB or 23 for WB inputs. The value of $\gamma_m$ used to achieve the above objective is determined iteratively (for non-zero $\|X_k\|^2$) according to the following pseudo-code:

```
/* Initialization */
e_min = -100, e_max = 20
e = max{e_min, -10 log_10 (||X_k||^2)/1.2}
s = +1, Δ_e = 8
/* main loop */
do {
  γ_m = 10^(e/20)
         143
  m' =   Σ  |round{γ_m X_k}|
         k=0
  if (m' == m)              then break
  else if (m' > m and s == +1)   then s = -1, Δ_e = Δ_e/2
  else if (m' < m and s == -1)   then s = +1, Δ_e = Δ_e/2
  end
  e = e + s · Δ_e
} while e ≤ e_max and Δ_e ≥ Δ_min
```

The quantized residual line spectrum $X_{cc}$ is then calculated as:

$$X_{cc}(k) = \begin{cases} \text{round}\{\gamma_m X_k\}; & 0 \le k < 144 \\ 0; & 144 \le k < 160, \end{cases} \quad (4.13.5\text{-}2)$$

If, on the rare occasion, the values of m and m' are different, the line spectrum shall be modified by adding or subtracting unit values to the quantized line spectrum $X_{cc}$. This guarantees that the resulting line spectrum can be reliably coded using the factorial coding method. The output index representing the line spectrum $X_{cc}$ is designated RLSIDX. This index comprises 131 bits for the ${}^{144}FPC_{28}$ case and 114 bits for the ${}^{144}FPC_{23}$ case.

In order to address complexity issues associated with encoding and decoding vector $X_{cc}$, a low resolution combinatorial approximation function F'(n,r) shall be used in place of the standard combinatorial relation $F(n,r) = {}^n C_r = n!/r!(n-r)!$. In particular, both the encoder and decoder utilize a combinatorial function generator F'(n,r) having the properties F'(n,r) ≥ (n,r) and F'(n,r) ≥ F'(n−1,r) + F'(n−1,r−1), which are sufficient to uniquely encode/decode vector $X_{cc}$. The function F'(n,r) is given as:

$$F'(n, r) = R'\left(\sum_{i=n-r+1}^{n} P'(i) - Q'(r)\right), \quad (4.13.5\text{-}3)$$

where P'(i) and Q'(r) are 32 bit lookup tables given as:

$$P'(i) = 2^{-21}\lfloor 2^{21}\log_2(i) + 1 \rfloor, \quad (4.13.5\text{-}4)$$
$$i \in [1, 2, \ldots, 144],$$
and $$Q'(r) = \begin{cases} 0, & r = 1 \\ \sum_{j=2}^{r} 2^{-14}\lfloor 2^{14}\log_2(j) - 1 \rfloor, & r \in [2, \ldots, 28]; \end{cases} \quad (4.13.5\text{-}5)$$

and where R'(k) is a multi-precision integer approximation of the function $R'(k) \approx 2^k$, given as:

$$R'(k) = \lfloor 2^{k_i - 19}\lfloor 2^{19} K_f \rfloor \rfloor, \quad (4.13.5\text{-}6)$$

where $k = k_i + k_f$ is broken down into integer and fractional components of k, and $K_f = 2^{k_f}$ is a Taylor series expansion of the fractional component of k. These operations significantly reduce the complexity necessary in calculating the combinatorial expressions by replacing multi-precision multiply and divide operations with 32 bit additions and a low complexity Taylor series approximation of $2^k$ followed by a multi-precision shift operation. All other components of the encoding/decoding operations are similar to that in 4.11.8.3.

While the invention has been particularly shown and described with reference to a particular embodiment, it will be understood by those skilled in the art that various changes in form and details may be made therein without departing from the spirit and scope of the invention. It is intended that such changes come within the scope of the following claims.

The invention claimed is:

1. A method for combinatorial coding and decoding, the method comprising the steps of:
   receiving a vector comprising speech, audio, image, or video;
   receiving a value n based on a number of positions in the vector;
   receiving a value d based on a number of occupied positions within the vector;
   generating a value F'(n,d) based on a logarithmic approximation of the combinatorial function of F(n,d) and comprising generating a logarithmic approximation of a numerator of F(n,d) and generating a logarithmic approximation of a denominator by subtracting a combinatorial function Q'(d) from the numerator; and
   using the value F'(n,d) to code or decode the vector to produce coded or decoded speech, audio, image, or video, wherein the step generating of the value F'(n,d) comprises the step of generating a value F'(n,d)=R'(k), where R'(k) is an approximation of the function $a^k$, and where a is a logarithm base,
   wherein the step of generating a value F'(n,d)=R'(k) further comprises the steps of:
   generating an integer component $k_i$ and a fractional component $k_f$ based on a value k such that $k = k_i + k_f$;
   generating a value $K_f$ wherein $K_f$ is based on a low resolution Talyor series expansion of $2^{k_f}$;
   producing the value R'(k) based on $K_f$.

2. The method of claim 1 wherein Q'(d) is an approximation of the function $Q(d) = \sum_{j=1}^{d} \log_a(j)$, where a is a logarithm base.

3. The method of claim 1 wherein $$Q'(d) = \sum_{j=2}^{d} 2^{-l(j)}\lfloor 2^{l(j)}\log_2(j) - 1 \rfloor,$$

where l(j) is a shift factor.

4. The method of claim 3 wherein the summation is generated as $$Q'(d) = \sum_{j=2}^{d} 2^{-l(j)}\lfloor 2^{l(j)}\log_2(j) - 1 \rfloor,$$

where l(j) is a shift factor.

5. The method of claim 1 wherein the step of producing the value R'(k) based on $K_f$ further comprises generating:

$$R'(k) = \lfloor 2^{k_i - l}\lfloor 2^l K_f \rfloor \rfloor.$$

6. The method of claim 1 wherein the value F'(n,d) such that $$F'(n,d) > \frac{n!}{d!(n-d)!}$$

and F'(n,d)>F'(n−1,d)+F'(n−1,d−1).

7. The method of claim 1 wherein the approximation of the function $a^k$ is obtained using a Taylor series expansion method.

8. An apparatus comprising:
   a vector generator receiving a vector comprising speech, audio, image, or video;
   a combinatorial function generator receiving a value n based on a number of positions in the vector, receiving a value d based on a number of occupied positions within the vector, and generating a value F'(n,d) based on a logarithmic approximation of the combinatorial function of F(n,d) and comprising generating a logarithmic approximation of a numerator of F(n,d) and generating a logarithmic approximation of a denominator by subtracting a combinatorial function Q'(d) from the numerator; and
   a coder/decoder using the value F'(n,d) to code or decode the vector to produce coded or decoded speech, audio, image, or video,
   said combinatorial function generator generating of the value F'(n,d) including generating a value F'(n,d)=R'(k), where R'(k) is an approximation of the function $a^k$, and where a is a logarithm base, generating an integer component $k_i$ and a fractional component $k_f$ based on a value k such that $k = k_i + k_f$; generating a value $K_f$ wherein $K_f$ is based on a low resolution Talyor series expansion of $2^{k_f}$, and producing the value R'(k) based on $K_f$.

9. The apparatus of claim 8 wherein Q'(d) is an approximation of the function $Q(d) = \sum_{j=1}^{d} \log_a(j)$ where a is a logarithm base.

10. The apparatus of claim 8 wherein $$Q'(d) = \sum_{j=2}^{d} 2^{-l(j)}\lfloor 2^{l(j)}\log_2(j) - 1 \rfloor,$$

where l(j) is a shift factor.

* * * * *